(12) United States Patent
Hsiao et al.

(10) Patent No.: US 10,103,727 B1
(45) Date of Patent: Oct. 16, 2018

(54) POWER SWITCH CIRCUIT AND INTEGRATED CIRCUIT OF POWER SWITCH CONTROLLER

(71) Applicant: uPI Semiconductor Corp., Hsinchu County (TW)

(72) Inventors: Chih-Wen Hsiao, Hsinchu County (TW); Wen-Chieh Tsai, Hsinchu County (TW)

(73) Assignee: uPI Semiconductor Corp., Hsinchu County (TW)

( * ) Notice: Subject to any disclaimer, the term of this patent is extended or adjusted under 35 U.S.C. 154(b) by 0 days.

(21) Appl. No.: 15/916,180

(22) Filed: Mar. 8, 2018

(30) Foreign Application Priority Data

Sep. 12, 2017 (TW) .............................. 106131291 A

(51) Int. Cl.
*H03K 17/16* (2006.01)
(52) U.S. Cl.
CPC .................. *H03K 17/162* (2013.01)
(58) Field of Classification Search
CPC .................................................... H03K 17/162
USPC .................................................. 327/390, 589
See application file for complete search history.

(56) References Cited

U.S. PATENT DOCUMENTS

| | | | | |
|---|---|---|---|---|
| 4,049,979 A | * | 9/1977 | Shieu | H03K 5/023 326/30 |
| 6,650,100 B1 | * | 11/2003 | Kohout | G05F 1/613 323/282 |
| 7,576,593 B2 | * | 8/2009 | Chang | H02M 3/073 327/536 |
| 7,848,125 B2 | * | 12/2010 | Miller | G11C 5/005 363/59 |
| 7,944,250 B2 | | 5/2011 | Jansen | |
| 9,065,392 B2 | * | 6/2015 | Myles | H03F 3/21 |
| 9,804,612 B2 | * | 10/2017 | Marvin | H02M 7/538 |
| 2006/0176102 A1 | * | 8/2006 | Ayres | H02M 3/073 327/536 |
| 2008/0007317 A1 | * | 1/2008 | Bodano | H03K 17/063 327/390 |
| 2011/0204724 A1 | * | 8/2011 | Verma | H02M 3/07 307/109 |
| 2013/0187626 A1 | | 7/2013 | Su et al. | |

* cited by examiner

*Primary Examiner* — Thomas Skibinski
(74) *Attorney, Agent, or Firm* — JCIPRNET

(57) ABSTRACT

A power switch circuit includes a first input voltage, a first switch element, a switcher, a first bootstrap capacitor, and a second bootstrap capacitor. The first switch element includes a first control end, a first input end, and a first output end. The first input end is coupled to the first input voltage. The first output end provides an output voltage. The switcher is coupled to the first switch element. The first bootstrap capacitor is coupled to the switcher and provides a first driving voltage. The second bootstrap capacitor is coupled to the switcher and provides a second driving voltage. The first bootstrap capacitor and the second bootstrap capacitor alternately supply the first driving voltage or the second driving voltage to the first control end through an operation of the switcher.

16 Claims, 4 Drawing Sheets

POWER SWITCH CIRCUIT AND INTEGRATED CIRCUIT OF POWER SWITCH CONTROLLER

CROSS-REFERENCE TO RELATED APPLICATION

This application claims the priority benefit of Taiwan application serial no. 106131291, filed on Sep. 12, 2017. The entirety of the above-mentioned patent application is hereby incorporated by reference herein and made a part of this specification.

BACKGROUND OF THE INVENTION

Field of the Invention

The invention relates to a power switching technique, and more particularly relates to a power switch circuit and an integrated circuit of a power switch controller.

Description of Related Art

In general, a power supply device includes a power switch circuit and a power conversion circuit. The power switch circuit generates an output voltage in response to an input voltage. The power conversion circuit converts the output voltage into a power voltage for use of the back-end load. Most of the conventional power switch circuits use a charge pump to boost the input voltage to the control voltage, so as to control the switch elements that are for receiving the input voltage in the power switch circuit.

FIG. 1 is a schematic diagram of the conventional power switch circuit. As shown in FIG. 1, a plurality of capacitors and a plurality of diodes that are connected in series with each other form charge pumps, and the power switch controller 11 in the power switch circuit controls the charge pump 12 and the charge pump 13 by a clock signal CLK, so as to respectively raise the first input voltage V11 and the second input voltage V12 to the first driving voltage DRV11 and the second driving voltage DRV12. When the power supply device requires the first input voltage V11, the switch 14 transmits the first driving voltage DRV11 to the first switch element 16, and the switch 15 disconnects the second driving voltage DRV12 and connects to the ground. Thereby, the first switch element 16 transmits the first input voltage V11 as the output voltage V13. On the other hand, when the power supply device requires the second input voltage V12, the switch 14 disconnects the first driving voltage DRV11 and connects to the ground, and the switch 15 transmits the second driving voltage DRV12 to the second switch element 17. The second switch element 17 transmits the second input voltage V12 as the output voltage V13.

However, the conventional power switch circuit uses multiple groups of capacitors and diodes, which increases the circuit complexity and production costs of the conventional power switch circuit. Particularly, under the condition that the power switch circuit has multiple input voltages, the conventional power switch circuit needs to increase the number of the charge pumps correspondingly. It would significantly increase the circuit complexity and production costs. Furthermore, the charge pump generates the driving voltage in response to the input voltage, and the driving voltage generated by the charge pump changes when the input voltage changes. As a result, the control voltage for controlling the switch element becomes unstable and causes the output voltage of the power switch circuit to be unstable.

SUMMARY OF THE INVENTION

The invention provides a power switch circuit and an integrated circuit of a power switch controller, which use two bootstrap capacitors to alternately supply a control voltage to be received by a first switch element, so as to reduce the circuit complexity and production costs of the power switch circuit and improve operational stability of the power switch circuit.

A power switch circuit of the invention includes a first input voltage, a first switch element, a switcher, a first bootstrap capacitor, and a second bootstrap capacitor. The first switch element includes a first control end, a first input end, and a first output end. The first input end is coupled to the first input voltage. The first output end provides an output voltage. The switcher is coupled to the first switch element. The first bootstrap capacitor is coupled to the switcher and provides a first driving voltage. The second bootstrap capacitor is coupled to the switcher and provides a second driving voltage. The first bootstrap capacitor and the second bootstrap capacitor alternately supply the first driving voltage or the second driving voltage to the first control end through an operation of the switcher.

An integrated circuit of a power switch controller of the invention is coupled to a first switch element, a first bootstrap capacitor, and a second bootstrap capacitor, and the integrated circuit includes an output voltage pin, a first input voltage pin, a first driving pin, a first pin, a second pin, a third pin, a fourth pin, and a switcher. The output voltage pin provides an output voltage. The first input voltage pin receives a first input voltage. The first driving pin is coupled to the first switch element. The first switch element includes a first control end, a first input end, and a first output end. The first input end is coupled to the first input voltage pin. The first output end is coupled to the output voltage pin. The first pin is coupled to a first end of the first bootstrap capacitor. The second pin is coupled to a second end of the first bootstrap capacitor. The third pin is coupled to a first end of the second bootstrap capacitor. The fourth pin is coupled to a second end of the second bootstrap capacitor. The switcher is coupled to the first driving pin. The first bootstrap capacitor and the second bootstrap capacitor alternately supply the first driving voltage or the second driving voltage to the first driving pin through an operation of the switcher.

Based on the above, the power switch circuit of the invention uses the first bootstrap capacitor and the second bootstrap capacitor to alternately supply the first driving voltage or the second driving voltage and uses the first driving voltage or the second driving voltage to drive the first switch element. Thereby, the circuit complexity and production costs of the power switch circuit are reduced. Since the driving voltage is alternately supplied by the first and the second bootstrap circuits, the control voltage is further stabilized, so as to improve the stability of the output voltage of the power switch circuit.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Figure 1:
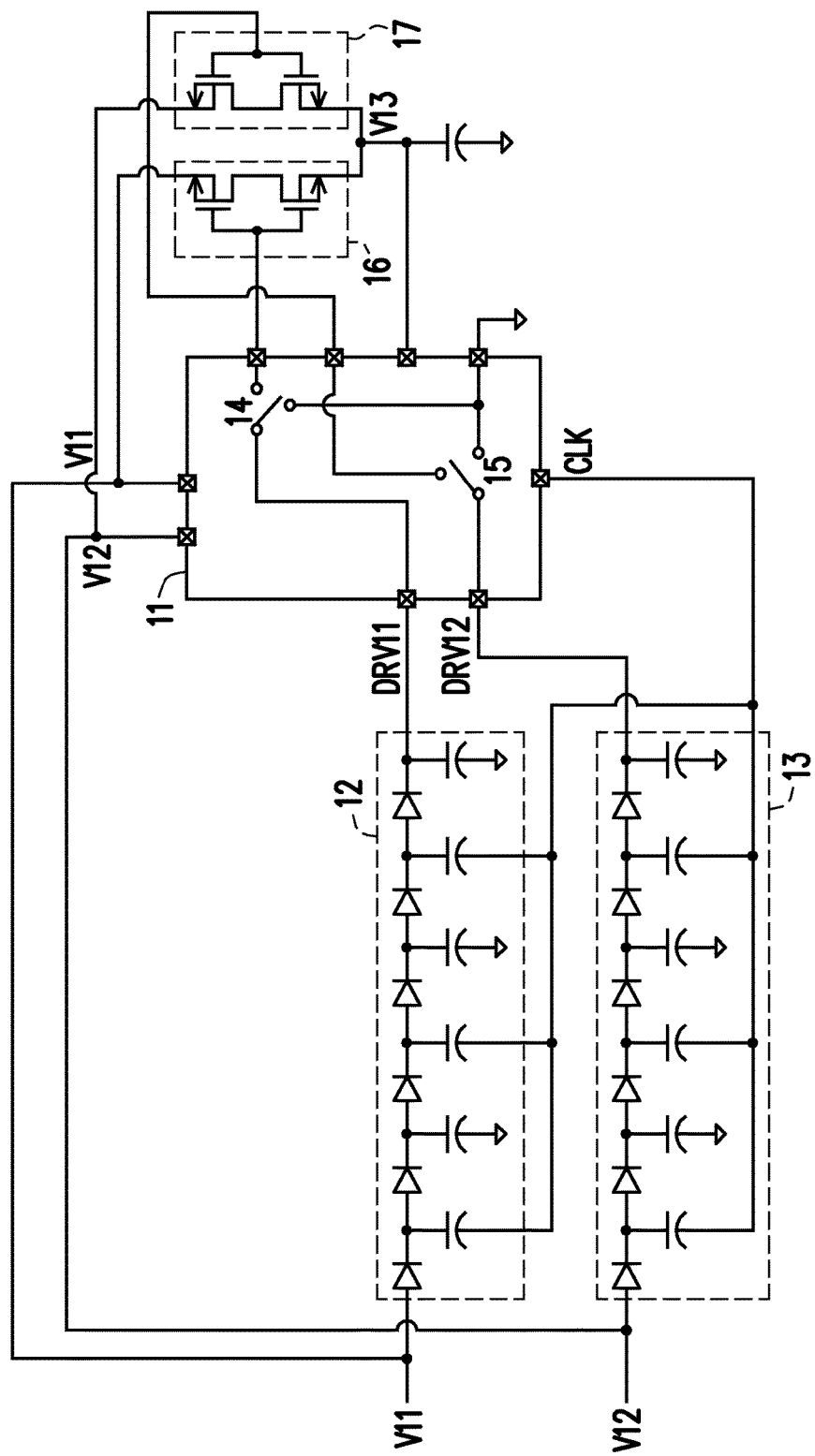
FIG. 1 is a schematic diagram of the conventional power switch circuit.
Figure 2A:
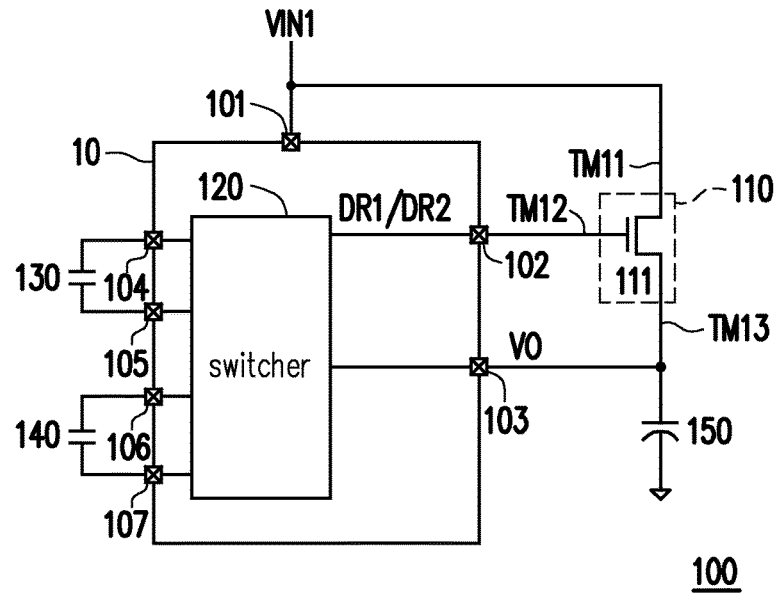
FIG. 2A is a schematic diagram of the power switch circuit according to an embodiment of the invention.

FIG. 2A is a schematic diagram of a power switch circuit according to an embodiment of the invention. As shown in FIG. 2A, a power switch circuit 100 includes a first switch element 110, a switcher 120, a first bootstrap capacitor 130, and a second bootstrap capacitor 140. In this embodiment, the switcher 120 includes a plurality of path switches and may be integrated in an integrated circuit 10 to form a power switch controller of the power switch circuit 100.

The first switch element 110 includes a switch 111, and the first switch element 110 has a first input end TM11, a first control end TM12, and a first output end TM13. The first input end TM11 receives a first input voltage VIN1 and is electrically connected to the first end of the switch 111. The first control end TM12 is electrically connected to the control end of the switch 111. The first output end TM13 is electrically connected to an output capacitor 150 and provides an output voltage VO.

The integrated circuit 10 of the power switch controller includes a first input voltage pin 101, a first driving pin 102, an output voltage pin 103, a first pin 104, a second pin 105, a third pin 106, and a fourth pin 107. The first input voltage pin 101 receives the first input voltage VIN1 and is coupled to the first input end TM11. The output voltage pin 103 is coupled to the first output end TM13. The first pin 104 is coupled to the first end of the first bootstrap capacitor 130. The second pin 105 is coupled to the second end of the first bootstrap capacitor 130. The third pin 106 is coupled to the first end of the second bootstrap capacitor 140. The fourth pin 107 is coupled to the second end of the second bootstrap capacitor 140. The switcher 120 is coupled to the first driving pin 102, the output voltage pin 103, the first pin 104, the second pin 105, the third pin 106, and the fourth pin 107.

The switcher 120 is coupled to the first bootstrap capacitor 130 and the second bootstrap capacitor 140. The first bootstrap capacitor 130 may provide a first driving voltage DR1. The second bootstrap capacitor 140 may provide a second driving voltage DR2. The first bootstrap capacitor 130 and the second bootstrap capacitor 140 may alternately provide the first driving voltage DR1 or the second driving voltage DR2 to the first control end TM12 through an operation of the switcher 120.

The power switch circuit 100 generates the first driving voltage DR1 and the second driving voltage DR2 for controlling the first switch element 110 according to the output voltage VO by the first and the second bootstrap capacitors 130 and 140. As compared with the conventional power switch circuit, the power switch circuit 100 of this embodiment does not require a charge pump to generate the first driving voltage DR1 and the second driving voltage DR2. Therefore, the circuit complexity and production costs of the power switch circuit 100 are reduced. In addition, since the first and the second bootstrap capacitors 130 and 140 alternately supply the first driving voltage DR1 and the second driving voltage DR2, the driving voltage for driving the first switch element 110 is not affected by attenuation of the driving voltage that results from discharge of the bootstrap capacitors. Thus, the power switch circuit 100 is capable of providing the output voltage VO stably for a long time.

Figure 2B:
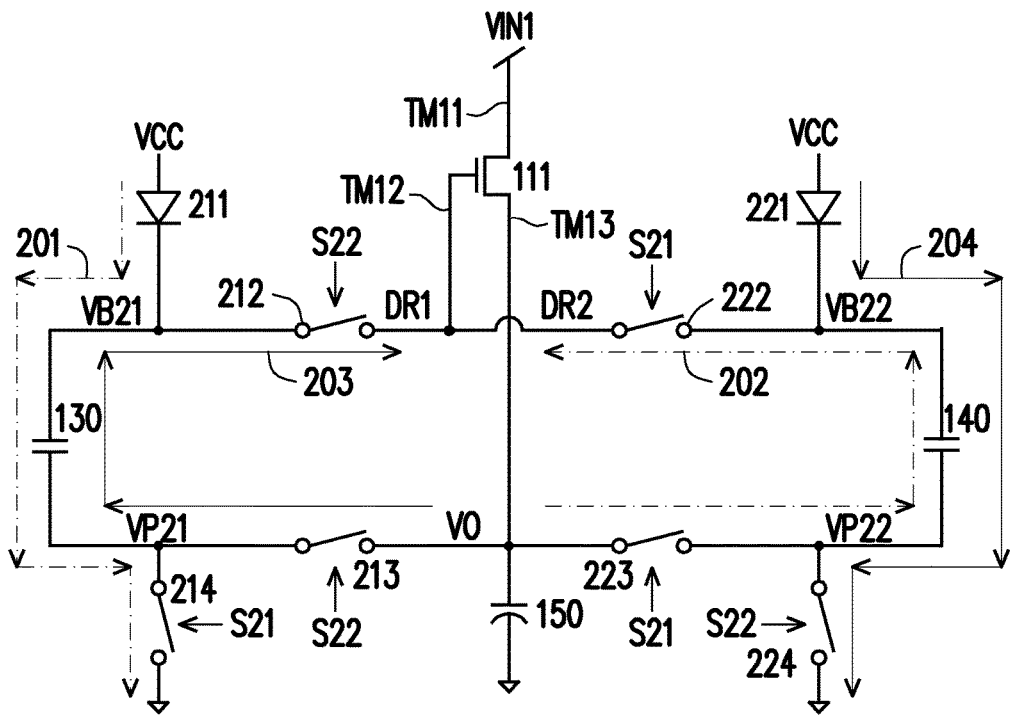
FIG. 2B is a circuit diagram for explaining the power switch circuit of FIG. 2A.
Figure 3:
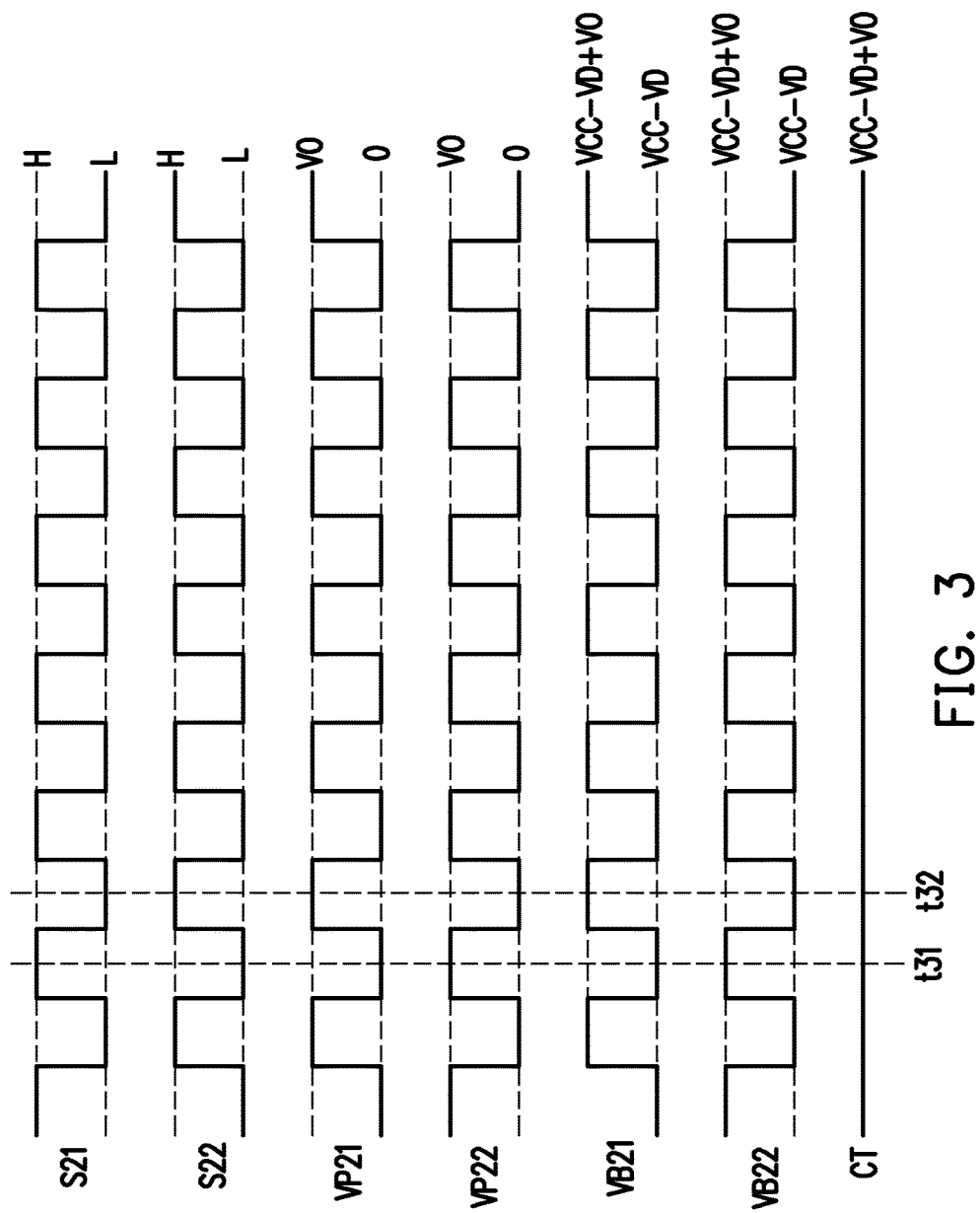
FIG. 3 is a timing diagram of the power switch circuit according to an embodiment of the invention.

FIG. 2B is a circuit diagram for explaining the power switch circuit of FIG. 2A, and FIG. 3 is a timing diagram of the power switch circuit according to an embodiment of the invention. An operation of the power switch circuit 100 is described hereinafter with reference to FIG. 2A, FIG. 2B, and FIG. 3.

As shown in FIG. 2A and FIG. 2B, the switcher 120 includes a first diode 211 and path switches 212 to 214, and the path switch 212 and the path switch 213 form a first switch group coupled between the switch element 111 and the first bootstrap capacitor 130. The first diode 211 receives an operating voltage VCC, and the first diode 211 is electrically connected to the first bootstrap capacitor 130. The path switch 212 is electrically connected to the first diode 211 and is electrically connected to the first control end TM12 of the first switch element 110 via the first driving pin 102 of the integrated circuit 10. The first bootstrap capacitor 130 is electrically connected between the first diode 211 and the path switch 214. The path switch 214 is electrically connected between the first bootstrap capacitor 130 and a ground. The path switch 213 is electrically connected to the first bootstrap capacitor 130 and is electrically connected to the first output end TM13 of the first switch element 110 via the output voltage pin 103 of the integrated circuit 10.

The switcher 120 further includes a second diode 221 and path switches 222 to 224, and the path switch 222 and the path switch 223 form a second switch group coupled between the switch element 111 and the second bootstrap capacitor 140. The second diode 221 is electrically connected to the second bootstrap capacitor 140 and receives the operating voltage VCC. The path switch 222 is electrically connected to the second diode 221 and the path switch 212. The path switch 224 is electrically connected between the second bootstrap capacitor 140 and the ground. The path switch 223 is electrically connected to the second bootstrap capacitor 140 and the path switch 213. In this embodiment, when the first switch group is turned on, the second switch group is turned off.

The first diode 211, the path switches 212 to 214, and the first bootstrap capacitor 130 form a first bootstrap circuit. The second diode 221, the path switches 222 to 224, and the second bootstrap capacitor 140 form a second bootstrap circuit. In other words, the first bootstrap circuit is coupled to the first control end TM12 and the first output end TM13 of the first switch element 110, and the first bootstrap circuit and the second bootstrap circuit are connected in parallel.

The first bootstrap circuit and the second bootstrap circuit respectively receive the operating voltage VCC and alternately supply the first driving voltage DR1 and the second driving voltage DR2. The first switch element 110 may turn on the switch 111 in response to the first driving voltage DR1 or the second driving voltage DR2, such that the output capacitor 150 may generate the output voltage VO. The first bootstrap circuit and the second bootstrap circuit may respectively add up the output voltage VO and the operating voltage VCC to generate the first driving voltage DR1 and the second driving voltage DR2. Therefore, the first driving voltage DR1 and the second driving voltage DR2 are both greater than the first input voltage VIN1. Moreover, the first driving voltage DR1 is equal to the second driving voltage DR2. The output voltage VO may be transmitted to a power conversion circuit (not shown), and the power conversion circuit may convert the output voltage VO into a power voltage for use of a back-end load.

More specifically, the first bootstrap circuit and the second bootstrap circuit respectively have a charge mode and a power supply mode. In addition, when the first bootstrap circuit enters the charge mode, the second bootstrap circuit enters the power supply mode. When the first bootstrap circuit enters the power supply mode, the second bootstrap circuit enters the charge mode. Furthermore, the power switch circuit 100 provides the first driving voltage DR1 by the first bootstrap circuit that enters the power supply mode and provides the second driving voltage DR2 by the second bootstrap circuit that enters the power supply mode.

For example, as shown in FIG. 3, at the time point t31, the power switch circuit 100 turns on the path switch 214, the path switch 222, and the path switch 223 by a control signal S21 at the high level H, and turns off the path switch 212, the path switch 213, and the path switch 224 by a control signal S22 at the low level L. In other words, when the first switch group formed of the path switch 212 and the path switch 213 is turned off, the second switch group formed of the path switch 222 and the path switch 223 is turned on.

For the first bootstrap circuit, the voltage VP21 of the second end of the first bootstrap capacitor 130 is pulled down to the ground voltage (i.e., 0V) as the path switch 214 is turned on and the path switches 212 and 213 are turned off. At this time, as indicated by a first charge path 201, the first bootstrap circuit charges the first bootstrap capacitor 130, and the voltage VB21 of the first end of the first bootstrap capacitor 130 is represented by (VCC−VD). VD respectively represents the turn-on voltage of the first diode 211 and the turn-on voltage of the second diode 221. In other words, at the time point t31, the first bootstrap circuit enters the charge mode, and the operating voltage VCC, the first diode 211, the first bootstrap capacitor 130, the path switch 214, and the ground form the first charge path 201. Thereby, the first bootstrap capacitor 130 is conducted to the ground via the switcher 120, and the first bootstrap circuit charges the first bootstrap capacitor 130.

For the second bootstrap circuit, the second bootstrap capacitor 140 and the output capacitor 150 are connected in series as the path switch 222 and the path switch 223 are turned on and the path switch 224 is turned off. At this time, as indicated by a second power supply path 202, the voltage VP22 of the second end of the second bootstrap capacitor 140 is pulled up to the output voltage VO, and the voltage VB22 of the first end of the second bootstrap capacitor 140 is represented by (VCC−VD+VO). Moreover, the second bootstrap circuit provides the second driving voltage DR2 to the first control end TM12 of the first switch element 110, and the second driving voltage DR2 is equal to the voltage VB22. In other words, at the time point t31, the second bootstrap circuit enters the power supply mode. At this time, the second bootstrap capacitor 140 is connected to the output capacitor 150 via the switcher 120. In addition, the second bootstrap circuit provides the second driving voltage DR2, and DRV12=VCC−VD+VO. In other words, at the time point t31, the control voltage CT of the first control end TM12 of the first switch element 110 is equal to the second driving voltage DR2, i.e., CT=VCC−VD+VO.

More specifically, at the time point t32, the power switch circuit 100 turns off the path switch 214, the path switch 222, and the path switch 223 by the control signal S21 at the low level L, and turns on the path switch 212, the path switch 213, and the path switch 224 by the control signal S22 at the high level H. In other words, when the first switch group formed of the path switch 212 and the path switch 213 is turned on, the second switch group formed of the path switch 222 and the path switch 223 is turned off.

For the first bootstrap circuit, the first bootstrap capacitor 130 and the output capacitor 150 are connected in series as the path switch 214 is turned off and the path switches 212 and 213 are turned on, and a first power supply path 203 is formed. At this time, the voltage VP21 of the second end of the first bootstrap capacitor 130 is pulled up to the output voltage VO, and the voltage VB21 of the first end of the first bootstrap capacitor 130 is represented by (VCC−VD+VO). Moreover, the first bootstrap circuit provides the first driving voltage DR1 to the first control end TM12 of the first switch element 110, and the first driving voltage DR1 is equal to the voltage VB21. In other words, at the time point t32, the first bootstrap circuit enters the power supply mode. At this time, the first bootstrap capacitor 130 is connected to the output capacitor 150 via the switcher 120. In addition, the first bootstrap circuit provides the first driving voltage DR1, and DR1=VCC−VD+VO. In other words, at the time point t32, the control voltage CT of the first control end TM12 of the first switch element 110 is equal to the first driving voltage DR1, i.e., CT=VCC−VD+VO.

For the second bootstrap circuit, as the path switches 222 and 223 are turned off and the path switch 224 is turned on, a second charge path 204 is formed. At this time, the voltage VP22 of the second end of the second bootstrap capacitor 140 is pulled down to the ground voltage, and the voltage VB22 of the first end of the second bootstrap capacitor 140 is represented by (VCC−VD). In other words, at the time point t32, the second bootstrap circuit enters the charge mode, and the operating voltage VCC, the second diode 221, the second bootstrap capacitor 140, the path switch 224, and the ground form the second charge path 204. Thereby, the second bootstrap capacitor 140 is conducted to the ground via the switcher 120, and the second bootstrap circuit charges the second bootstrap capacitor 140.

In another embodiment, the path switch 212 and the path switch 222 may be composed of diodes respectively. For example, when the path switch 212 is composed of a diode, the anode of the diode is electrically connected to the first diode 211 and the cathode of the diode is electrically connected to the first control end TM12 of the first switch element 110. In addition, when the path switch 222 is composed of a diode, the anode of the diode is electrically connected to the first diode 221 and the cathode of the diode is electrically connected to the first control end TM12 of the first switch element 110.

Figure 4:
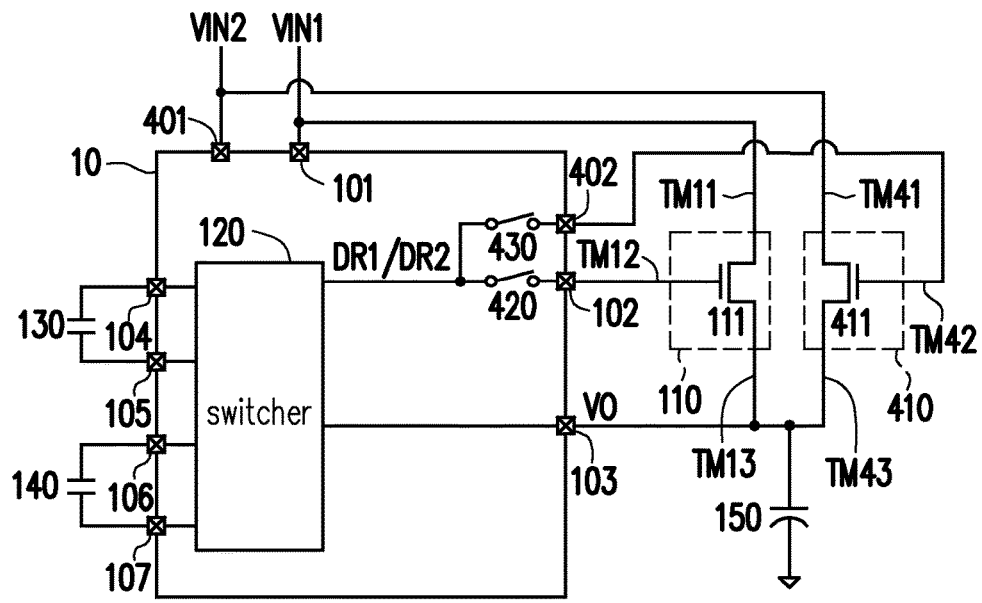
FIG. 4 is a schematic diagram of the power switch circuit according to another embodiment of the invention.
Figure 5:
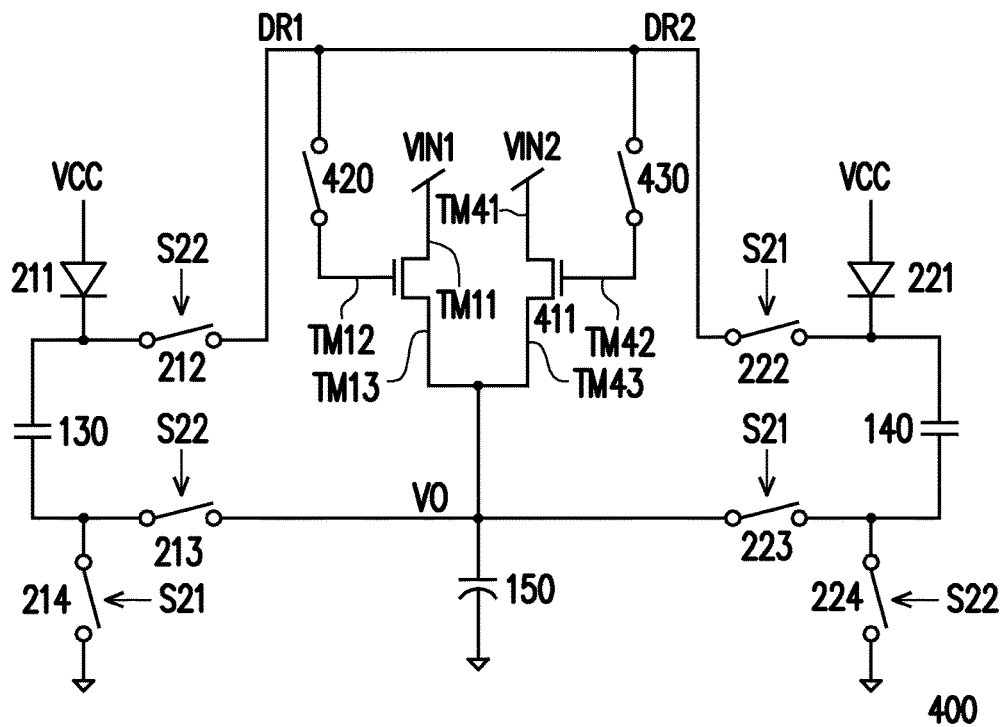
FIG. 5 is a circuit diagram for explaining the power switch circuit of FIG. 4.

In another embodiment, the power switch circuit 100 may also have a plurality of input voltages, and the power switch circuit 100 may switch the first driving voltage DR1 and the second driving voltage DR2 by a plurality of switching switches, so as to use the first driving voltage DR1 and the second driving voltage DR2 as the control voltage CT for selectively controlling one of the switch elements. For example, FIG. 4 is a schematic diagram of the power switch circuit according to another embodiment of the invention, and FIG. 5 is a circuit diagram for explaining the power switch circuit of FIG. 4. As compared with the embodiment of FIG. 2A and FIG. 2B, a power switch circuit 400 of FIG. 4 further includes a second switch element 410, a first switching switch 420, and a second switching switch 430. The integrated circuit 10 of the power switch controller further includes a second input voltage pin 401 and a second driving pin 402.

As shown in FIG. 4 and FIG. 5, the second switch element 410 includes a switch 411, and the second switch element 410 has a second input end TM41, a second control end TM42, and a second output end TM43. The second input end TM41 receives a second input voltage VIN2 and the second output end TM43 is electrically connected to the output capacitor 150. The integrated circuit 10 receives the second input voltage VIN2 via the second input voltage pin 401 and is electrically connected to the second control end TM42 of the second switch element 410 via the second driving pin 402. The first switching switch 420 and the second switching switch 430 may be integrated in the integrated circuit 10. Moreover, the first switching switch 420 is electrically connected to the switcher 120 and is electrically connected to the first control end TM12 of the first switch element 110 via the first driving pin 102. The second switching switch 430 is electrically connected to the switcher 120 and is electrically connected to the second control end TM42 of the second switch element 410 via the second driving pin 402.

In terms of operation, the power switch circuit 400 may turn on one of the first switching switch 420 and the second switching switch 430 to use the first driving voltage DR1 and the second driving voltage DR2 to control the first switch element 110 or the second switch element 410. For example, when the first switching switch 420 is turned off and the second switching switch 430 is turned on, the first bootstrap circuit and the second bootstrap circuit alternately supply the first driving voltage DR1 and the second driving voltage DR2 to the second control end TM42 of the second switch element 410. At this time, the switch 411 of the second switch element 410 is turned on, and the second input voltage VIN2 becomes the output voltage VO via the second switch element 410. On the other hand, when the first switching switch 420 is turned on and the second switching switch 430 is turned off, the first bootstrap circuit and the second bootstrap circuit alternately supply the first driving voltage DR1 and the second driving voltage DR2 to the first control end TM12 of the first switch element 110. At this time, the switch 111 of the first switch element 110 is turned on, and the first input voltage VIN1 becomes the output voltage VO via the first switch element 110. The first input voltage VIN1 and the second input voltage VIN2 may be the same or two different voltages. The detailed operation of each element in the power switch circuit 400 as shown in FIG. 4 and FIG. 5 has been included in the embodiment of FIG. 2A to FIG. 3, and thus is not repeated hereinafter.

To sum up, the power switch circuit of the invention uses the first bootstrap capacitor and the second bootstrap capacitor to alternately supply the first driving voltage or the second driving voltage and uses the first driving voltage or the second driving voltage to control the first switch element or the second switch element. Thereby, the circuit complexity and production costs of the power switch circuit are reduced. Furthermore, since the first and the second bootstrap capacitors alternately supply the first driving voltage or the second driving voltage, the control voltage for controlling the first switch element or the second switch element is further stabilized for the power switch circuit to provide the output voltage stably for a long time.

It will be apparent to those skilled in the art that various modifications and variations can be made to the disclosed embodiments without departing from the scope or spirit of the invention. In view of the foregoing, it is intended that the invention covers modifications and variations provided that they fall within the scope of the following claims and their equivalents.

What is claimed is:

1. A power switch circuit, comprising:
    a first input voltage;
    a first switch element comprising a first control end, a first input end and a first output end, wherein the first input end is coupled to the first input voltage, and the first output end provides an output voltage;
    a switcher coupled to the first switch element;
    a first bootstrap capacitor coupled to the switcher and providing a first driving voltage; and
    a second bootstrap capacitor coupled to the switcher and providing a second driving voltage,
    wherein the first bootstrap capacitor and the second bootstrap capacitor alternately provide the first driving voltage or the second driving voltage to the first control end through an operation of the switcher.

2. The power switch circuit according to claim 1, wherein the first driving voltage is equal to the second driving voltage.

3. The power switch circuit according to claim 1, further comprising a first switching switch, a second switching switch, a second input voltage and a second switch element, wherein the first input voltage becomes the output voltage via the first switch element when the first switching switch is turned on and the second switching switch is turned off, and the second input voltage becomes the output voltage via the second switch element when the first switching switch is turned off and the second switching switch is turned on.

4. The power switch circuit according to claim 3, wherein the first input voltage and the second input voltage are different voltages.

5. The power switch circuit according to claim 1, wherein the switcher comprises a first switch group and a second switch group, and the first switch group is coupled between the first switch element and the first bootstrap capacitor, and the second switch group is coupled between the first switch element and the second bootstrap capacitor.

6. The power switch circuit according to claim 5, wherein when the first switch group is turned on, the second switch group is turned off.

7. The power switch circuit according to claim 5, wherein the switcher further comprises a first path switch coupled to the first bootstrap capacitor, and an operating voltage, the first bootstrap capacitor, the first path switch, and a ground form a first charge path.

8. The power switch circuit according to claim 5, wherein the switcher further comprises a second path switch coupled to the second bootstrap capacitor, and the operating voltage, the second bootstrap capacitor, the second path switch, and the ground form a second charge path.

9. An integrated circuit of a power switch controller, coupled to a first switch element, a first bootstrap capacitor and a second bootstrap capacitor, the integrated circuit comprising:
    an output voltage pin;
    a first input voltage pin receiving a first input voltage;
    a first driving pin coupled to the first switch element, wherein the first switch element comprises a first control end, a first input end, and a first output end, the first input end is coupled to the first input voltage pin, and the first output end is coupled to the output voltage pin and provides an output voltage;
    a first pin coupled to a first end of the first bootstrap capacitor;

a second pin coupled to a second end of the first bootstrap capacitor;

a third pin coupled to a first end of the second bootstrap capacitor;

a fourth pin coupled to a second end of the second bootstrap capacitor; and a switcher coupled to the first driving pin, wherein the first bootstrap capacitor and the second bootstrap capacitor alternately provide a first driving voltage or a second driving voltage to the first driving pin through an operation of the switcher.

10. The integrated circuit according to claim 9, wherein the first driving voltage is equal to the second driving voltage.

11. The integrated circuit according to claim 9, wherein the integrated circuit is further coupled to a second switch element, and the integrated circuit further comprises:

a second input voltage pin receiving a second input voltage;

a second driving pin coupled to the second switch element;

a first switching switch coupled to the first driving pin and the switcher; and a second switching switch coupled to the second driving pin and the switcher, wherein the first input voltage becomes the output voltage via the first switch element when the first switching switch is turned on and the second switching switch is turned off, and the second input voltage becomes the output voltage via the second switch element when the first switching switch is turned off and the second switching switch is turned on.

12. The integrated circuit according to claim 11, wherein the first input voltage and the second input voltage are different voltages.

13. The integrated circuit according to claim 9, wherein the switcher comprises a first switch group and a second switch group, and the first switch group is coupled between the first switch element and the first bootstrap capacitor, and the second switch group is coupled between the first switch element and the second bootstrap capacitor.

14. The integrated circuit according to claim 13, wherein when the first switch group is turned on, the second switch group is turned off.

15. The integrated circuit according to claim 13, wherein the switcher further comprises a first path switch coupled to the first bootstrap capacitor, and an operating voltage, the first bootstrap capacitor, the first path switch, and a ground form a first charge path.

16. The integrated circuit according to claim 15, wherein the switcher further comprises a second path switch coupled to the second bootstrap capacitor, and the operating voltage, the second bootstrap capacitor, the second path switch, and the ground form a second charge path.

\* \* \* \* \*